(12) United States Patent
Arnold et al.

(10) Patent No.: US 12,134,834 B2
(45) Date of Patent: Nov. 5, 2024

(54) COMPOSITION FOR COPPER BUMP ELECTRODEPOSITION COMPRISING A POLYAMINOAMIDE TYPE LEVELING AGENT

(71) Applicant: BASF SE, Ludwigshafen am Rhein (DE)

(72) Inventors: Marco Arnold, Ludwigshafen am Rhein (DE); Alexander Fluegel, Ludwigshafen am Rhein (DE); Charlotte Emnet, Ludwigshafen am Rhein (DE); Nadine Engelhardt, Ludwigshafen am Rhein (DE)

(73) Assignee: BASF SE, Ludwigshafen am Rhein (DE)

( * ) Notice: Subject to any disclaimer, the term of this patent is extended or adjusted under 35 U.S.C. 154(b) by 49 days.

(21) Appl. No.: 17/995,186

(22) PCT Filed: Mar. 24, 2021

(86) PCT No.: PCT/EP2021/057522
§ 371 (c)(1),
(2) Date: Sep. 30, 2022

(87) PCT Pub. No.: WO2021/197950
PCT Pub. Date: Oct. 7, 2021

(65) Prior Publication Data
US 2023/0142238 A1    May 11, 2023

(30) Foreign Application Priority Data
Apr. 3, 2020 (EP) .................................. 20168057

(51) Int. Cl.
C25D 3/38    (2006.01)

(52) U.S. Cl.
CPC ..................... *C25D 3/38* (2013.01)

(58) Field of Classification Search
None
See application file for complete search history.

(56) References Cited

U.S. PATENT DOCUMENTS

| | | | |
|---|---|---|---|
| 5,435,898 A | 7/1995 | Commander et al. | |
| 6,425,996 B1 | 7/2002 | Dahms et al. | |
| 2012/0292193 A1 | 11/2012 | Roeger-Goepfert et al. | |
| 2014/0097092 A1 | 4/2014 | Roeger-Goepfert et al. | |
| 2016/0076160 A1 | 3/2016 | Whitten et al. | |

FOREIGN PATENT DOCUMENTS

| | | |
|---|---|---|
| WO | 2010069810 A1 | 6/2010 |
| WO | 2010115717 A1 | 10/2010 |
| WO | 2010115756 A1 | 10/2010 |
| WO | 2010115757 A1 | 10/2010 |
| WO | 2010115796 A1 | 10/2010 |
| WO | 2011012462 A2 | 2/2011 |
| WO | 2011012475 A1 | 2/2011 |
| WO | 2011064154 A2 | 6/2011 |
| WO | 2011151785 A1 | 12/2011 |
| WO | 2012085811 A1 | 6/2012 |
| WO | 2014072885 A2 | 5/2014 |

(Continued)

OTHER PUBLICATIONS

International Search Report and Written Opinion for PCT/EP2021/057522 issued on Jun. 10, 2021, 9 pages.

(Continued)

*Primary Examiner* — Wojciech Haske
(74) *Attorney, Agent, or Firm* — Armstrong Teasdale LLP

(57) ABSTRACT

Described herein is a composition including copper ions, an acid, and at least one polyaminoamide including, a group of formula L1

$$[A-B-A'-Z]_n[Y-Z]_m \quad (L1)$$

where
B is a diacid fragment of formula L2

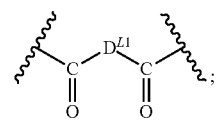

(L2)

A, A' are amine fragments independently selected from the group consisting of formula L3a

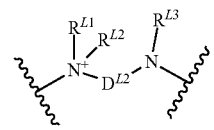
(L3a)

and formula L3b

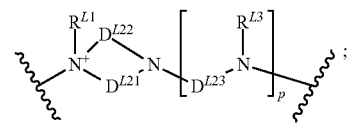
(L3b)

Y is a co-monomer fragment;
Z is a coupling fragment of formula L4

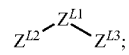

(L4)

(Continued)

n is an integer of from 1 to 400; and
m is 0 or an integer of from 1 to 400.

20 Claims, No Drawings

(56) References Cited

FOREIGN PATENT DOCUMENTS

| WO | 2016020216 A1 | 2/2016 |
| WO | 2018073011 A1 | 4/2018 |
| WO | 2018114985 A1 | 6/2018 |
| WO | 2018219848 A1 | 12/2018 |
| WO | 2019043146 A1 | 3/2019 |

OTHER PUBLICATIONS

European Search Report for EP Patent Application No. 20168057.6, Issued on Sep. 15, 2020, 3 pages.

COMPOSITION FOR COPPER BUMP ELECTRODEPOSITION COMPRISING A POLYAMINOAMIDE TYPE LEVELING AGENT

CROSS-REFERENCE TO RELATED APPLICATIONS

This application is a U.S. National Phase Application of PCT/EP2021/057522, filed Mar. 24, 2021, which claims the benefit of priority to European Patent Application No. 20168057.6, filed Apr. 3, 2020, the entire contents of which are hereby incorporated by reference herein.

BACKGROUND OF THE INVENTION

The invention relates to a copper electroplating composition comprising a polyaminoamide type leveling agent, its use and a process for copper bump electrodeposition.

Bumps are formed on a surface of a wafer having integrated circuits, such as LSIs. Such bumps constitute a part of interconnects of an integrated circuit and serve as terminals for connection to a circuit of an external package substrate (or a circuit substrate). The bumps are generally disposed along a periphery of a semiconductor chip (or die) and are connected to an external circuit by gold wires according to a wire bonding method or by leads according to a TAB method.

With the recent progress toward higher integration and higher density of semiconductor devices, the number of bumps for connection to external circuits is increasing, giving rise to the necessity to form bumps over the entire area of the surface of a semiconductor chip. Further, the need for shorter interconnect spacing has led to the use of a method (flip chip method) which involves flipping a semiconductor chip having a large number of bumps formed on its surface and connecting the bumps directly to a circuit substrate.

Electroplating is widely employed as a method of forming bumps. A process of forming bumps on a surface of a wafer having integrated circuits is one of the most important processes in a final stage of manufacturing of a semiconductor device. It is to be noted in this regard that an integrated circuit is formed on a wafer through many manufacturing processes. Therefore, very high reliability is required for a bump forming process which is performed on a wafer that has passed all the preceding processes. With the progress toward smaller-sized semiconductor chips, the number of bumps for connection to external circuits is increasing and bumps themselves are becoming smaller sized. Accordingly, a need exists to enhance the accuracy of positioning for bonding of a semiconductor chip to a circuit substrate such as a package substrate. In addition, there is a strong demand for no defect being produced in a bonding process in which bumps are melted and solidified.

Generally, copper bumps are formed on a seed layer of a wafer which is electrically connected to integrated circuits. A resist having openings is formed on a seed layer, and copper is deposited by copper electroplating on the exposed surface of the seed layer in the openings to thereby form copper bumps. The seed layer comprises a barrier layer, e.g. composed of titanium, to prevent diffusion of copper into the dielectric. After filling the openings in the resist with copper, the resist is removed, and then the copper bumps are subjected to reflow processing.

The need to fit more functional units into ever-tinier spaces drives the integrated circuit industry to bump processes for package connections. A second driver is to maximize the amount of input/output connections for a given area. With decreasing diameter of and distance between the bumps the connection density can be increased. These arrays are realized with copper bumps or p-pillars on which a tin or tin alloy solder cap is plated. In order to assure that every bump is getting contacted across a wafer, besides a void-free deposition and reflow, uniform deposition height is needed. In addition, alternative packaging technologies like Fan-Out technologies require redistribution layers (RDL) made of copper. These RDLs require uniform plating at various line spaces as well as on pads with different dimensions.

To achieve this uniform deposition so-called levelers may be used. In literature, a variety of different leveling compounds has been described for other electroplating applications. In most cases, leveling compounds are N-containing and optionally substituted and/or quaternized polymers, such as polyethylene imine, polyglycine, poly(allylamine), polyaniline (sulfonated), polyurea, polyacrylamide, poly (melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, polyalkoxylated polyamides and polyalkanolamines.

US 2012/292193 A discloses leveling agents comprising polyaminoamides, alkoxylated polyaminoamides, functionalized polyaminoamides, and functionalized and alkoxylated polyaminoamides. US 2014/097092 A discloses aromatic PAAs for use in through silicon via copper electrodeposition application. In WO 2014/072885 polyaminoamides are described which may be obtained by reacting at least one diamine with at least one N,N'-bisacrylamide.

U.S. Pat. No. 6,425,996 B1 discloses leveling agents comprising the reaction product of polyaminoamides and epihalohydrins, dihalohydrins and 1-halogen-2,3-propanediols, respectively.

US2016/0076160 A1 discloses an electrolytic plating composition useful in filling submicron features of a semiconductor integrated circuit device or through silicon vias which contains a leveler that comprises the reaction product of an aliphatic di(t-amine) with an alkylating agent. There is still a need in the electronic industry for an acidic copper electroplating bath which leads to bump deposit with a good morphology, particularly a low roughness, in combination with an improved uniformity in height, also called within-die coplanarity (COP).

For alkaline zinc or zinc alloy, e.g. ZnFeCo alloy, electrodeposition compositions specific cationic polymers are used to enhance brightness and alloy components uniformity. One of these cationic polymers e.g. disclosed in U.S. Pat. No. 5,435,898 is MIRAPOL AD-1 of formula

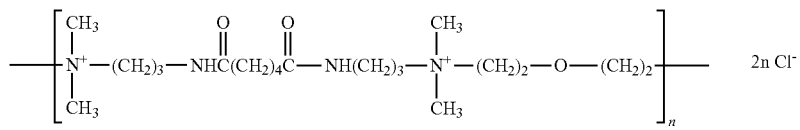

It is an object of the present invention to provide an acidic copper electroplating composition that provides copper deposits showing a good morphology, particularly a low roughness and which is capable of filling recessed features on the micrometer scale without substantially forming defects, such as but not limited to voids. It is a further object of the present invention to provide a copper electroplating bath that provides a uniform and planar copper deposit, in particular in recessed features of 500 nanometers to 500 micrometers widths such as bumps.

SUMMARY OF THE INVENTION

Surprisingly, it has now been found, that the use of particular cationic aminoamide polymers show extraordinary leveling properties in copper bump and RDL electroplating.

Therefore, the present invention provides a composition comprising copper ions, an acid, and at least one polyaminoamide comprising, a group of formula L1

$$[A-B-A'-Z]_n[Y-Z]_m \quad (L1)$$

wherein
B is a diacid fragment of formula L2

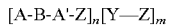

A, A' are amine fragments independently selected from formula L3a

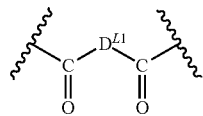

or of Formula L3b

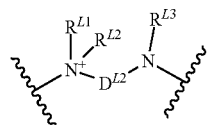

$D^{L1}$ is selected from
(a) a chemical bond or
(b) a divalent group selected from
  (i) $C_1$-$C_{20}$-alkanediyl which may optionally be interrupted by a double bond, an imino group or is optionally, completely or partially, a constituent of one or more saturated, unsaturated or aromatic 5- to 10-membered rings,
  (ii) an ether or polyether group of formula L2a $$\text{-}(D^{L10}\text{-}O\text{-})_o D^{L10}\text{-} \quad (L2a)$$

$D^{L2}$ is a divalent group selected from
(a) a linear or branched $C_1$ to $C_{10}$ alkanediyl, which may optionally be interrupted by $NR^{L10}$, O or S, or substituted by one or more, preferably 1 or 2 groups $NR^{L10}R^{L11}$ or $OR^{L10}$, or
(b) -$D^{L11}$-$Ar^{L11}$-$D^{L11}$-;
$D^{L10}$ is selected from a $C_1$-$C_6$-alkanediyl, preferably ethanediyl or propanediyl;
$D^{L11}$ is selected from a $C_1$-$C_6$-alkanediyl, preferably methanediyl or ethanediyl;
$Ar^{L11}$ is a $C_6$ to $C_{12}$ aromatic moiety, preferably p-phenylene;
$D^{L21}$, $D^{L22}$ are
(a) independently selected from a linear or branched $C_1$ to $C_6$ alkanediyl, or
(b) both, together with the adjacent two N atoms, part of a 5 or 6-membered aromatic heterocyclic ring system;
$D^{L23}$ is a $C_1$ to $C_6$ alkanediyl;
$R^{L1}$, $R^{L2}$ are independently selected from a $C_1$ to $C_6$ alkyl;
$R^{L3}$ is selected form H and a $C_1$ to $C_6$ alkyl;
Y is a co-monomer fragment;
Z is a coupling fragment of formula L4

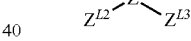

$Z^{L1}$, is selected from
(a) a linear or branched $C_1$ to $C_{12}$ alkanediyl, which may be interrupted by one or more O atoms, preferably a $C_1$ to C alkanediyl, which may be interrupted by 1 or two O atoms, or
(b) a divalent group -$D^{L11}$-$Ar^{L11}$-$D^{L11}$-;
$Z^{L2}$, $Z^{L3}$ are independently selected from a chemical bond and hydroxyethanediyl;
n is an integer of from 1 to 400;
m is 0 or an integer of from 1 to 400;
o is an integer of from 1 to 100; and
p is i) 0 or 1, if $D^{L21}$ and $D^{L22}$ are independently selected from a linear or branched $C_1$ to $C_6$ alkanediyl; or ii) 0, if $D^{L21}$ and $D^{L22}$ are both, together with the adjacent two N atoms, part of a 5 or 6-membered aromatic heterocyclic ring system.

The leveling agents according to the present invention are particularly useful for filling of recessed features having aperture sizes of 500 nm to 500 μm, particularly those having aperture sizes of 1 to 200 μm. The leveling agents are particularly useful for depositing copper bumps.

Due to the leveling effect of the leveling agents, surfaces are obtained with an improved coplanarity of the plated copper bumps. The copper deposits show a good morphology, particularly a low roughness. The electroplating composition is capable of filling recessed features on the micrometer scale without substantially forming defects such as but not limited to voids. The electroplating composition ensures uniform plating at various line spaces as well as on pads with different dimensions which makes it particularly useful for RDL applications.

Furthermore, the leveling agents according to the invention lead to reduced impurities, such as but not limited to organics, chloride, sulfur, nitrogen, or other elements. Especially, when Solder is directly plated on Copper higher organic impurity levels lead to pronounced Kirkendall voiding. These voids lower the reliability of the solder stack and is therefore less preferred. The additives described herein additionally facilitate high plating rates and allows plating at elevated temperature.

A further advantage of the leveling agents according to the invention is its flexibility with respect to adaption of nitrogen-content, hydrophilicity, charge and charge density, suppressing capabilities which makes it easier to adapt them to the very specific needs of the substrate.

The invention further relates to the use of the aqueous composition as described herein for depositing copper on a substrate comprising a recessed feature comprising a conductive feature bottom and a dielectric feature side wall, wherein the recessed feature has an aperture size from 500 nm to 500 µm.

The invention further relates to a process for electrodepositing copper on a substrate comprising a recessed feature comprising a conductive feature bottom and a dielectric feature side wall, the process comprising:
(a) contacting a composition as described herein with the substrate, and
(b) applying a current to the substrate for a time sufficient to deposit a copper layer into the recessed feature,
wherein the recessed feature has an aperture size from 500 nm to 500 µm.

DETAILED DESCRIPTION OF THE INVENTION

It has been found, that quaternized coupled aminoamide polymers may advantageously be used as leveling agents in copper electroplating of bump structures showing an improved leveling performance. The quaternized coupled aminoamide polymers are also referred to herein as "cationic aminoamide polymers", "coupled aminoamide polymers", "coupled aminoamide", "leveling agent" or "leveler".

As used herein, "accelerator" refers to an organic additive that increases the plating rate of the electroplating bath. The terms "accelerator" and "accelerating agent" are used interchangeably throughout this specification. In literature, sometimes the accelerator component is also named "brightener" or "brightening agent". "Suppressing agent" or "suppressor" refers to an organic compound that decreases the plating rate of the electroplating bath and ensures that the recessed features are voidless filled from the bottom to the top (so called "bottom-up filling"). The terms "suppressors" and "suppressing agents" are used interchangeably throughout this specification. "Leveler" refers to an organic compound that is capable of providing a substantially planar metal deposit over areas with a higher or lower number of recessed features, or different areas across a wafer or die. The terms "levelers", "leveling agents" and "leveling additive" are used interchangeably throughout this specification.

"Aperture size" according to the present invention means the smallest diameter or free distance of a recessed feature before plating. The terms "width", "diameter", "aperture" and "opening" are used herein, depending on the geometry of the feature (trench, via, etc.) synonymously. As used herein, "aspect ratio" means the ratio of the depth to the aperture size of the recessed feature.

As used herein, "chemical bond" means that the respective moiety is not present but that the adjacent moieties are bridged so as to form a direct chemical bond between these adjacent moieties. By way of example, if in a molecule A-B-C the moiety B is a chemical bond then the adjacent moieties A and C together form a group A-C.

The term "$C_x$" means that the respective group comprises x numbers of C atoms. The term "$C_x$ to $C_y$ alkyl" means alkyl with a number x to y of carbon atoms and, unless explicitly specified, includes unsubstituted linear, branched and cyclic alkyl. As used herein, "alkanediyl" refers to a diradical of linear, branched or cyclic alkanes or a combination thereof.

As used herein, "aromatic rings" cover aryl and heteroaryl groups.

Leveling Agents According to the Invention

Besides copper ions and an acid, the metal electroplating composition comprises at least one polyaminoamide comprising a group, preferably consisting of a group of formula I:

$$[A\text{-}B\text{-}A'\text{-}Z]_n[Y\text{—}Z]_m \qquad (L1)$$

The additive according to Formula L1 is generally obtainable by first reacting an amine compound comprising a tertiary amino group and a primary or secondary amino group with a diacid 'b' in a molar ratio of approx. 2:1 to form an aminoamide compound a-B-a'. In contrast to the compounds disclosed in U.S. Pat. No. 6,425,996 B1, discrete monomeric compounds are received in this intermediate product.

Afterwards this monomeric aminoamide intermediate compound is reacted with a coupling agent 'z' to connect several aminoamide compounds with each other to form the coupled aminoamide $[A\text{-}B\text{-}A'\text{-}Z]_n$ according to the invention. In this case m is 0.

By way of example, this reaction scheme is illustrated by starting from 3-Aminopropyldimethylamine, adipinic acid and epichlorohydrine:

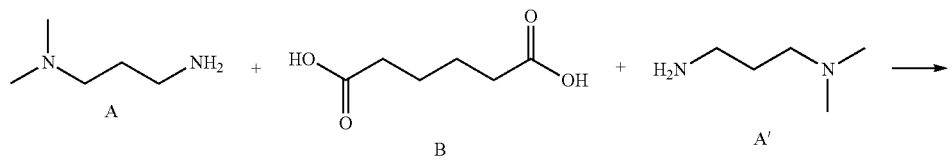

-continued

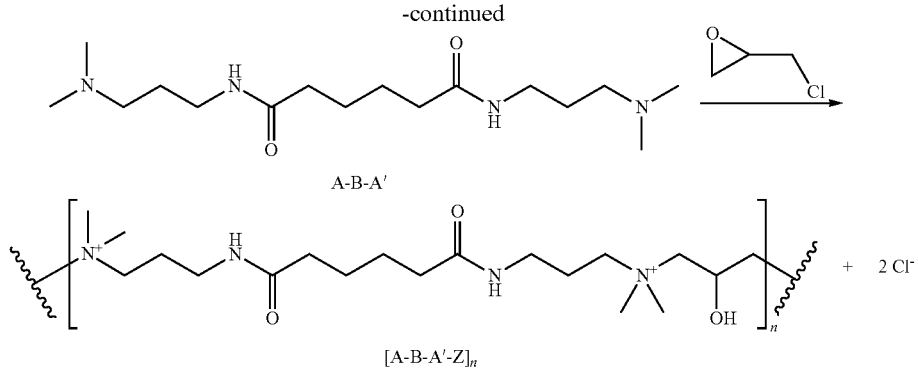

A-B-A'

[A-B-A'-Z]$_n$

In a first step discrete aminoamide monomers A-B-A' are prepared, which are then coupled together with the coupling agent Z. It is also possible to co-couple further amine co-monomers Y comprising a tertiary amino group and a secondary or tertiary amino group with the aminoamide compound. In this case m is equal to or greater than 1.

The fragments A, A', B, Z and Y are described in the following in more detail.

The diacid compounds 'b' forms a diacid fragment B of formula L2

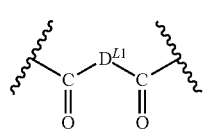
(L2)

wherein the diacid spacer $D^{L1}$ is selected from (a) a chemical bond or, preferably, (b) a divalent group selected from (i) $C_1$-$C_{20}$-alkanediyl which may optionally be interrupted by a double bond, an imino group or is optionally, completely or partially, a constituent of one or more saturated, unsaturated or aromatic 5- to 10-membered rings, (ii) an ether or polyether group of formula L2a -(D$^{L10}$-O-]$_o$D$^{L10}$- (L2a)

wherein $D^{L10}$ is selected from a $C_1$-$C_6$-alkanediyl, preferably a $C_1$-$C_4$-alkanediyl, most preferably ethanediyl or propanediyl and o is an integer of from 1 to 100, preferably of from 1 to 20, most preferably from 1 to 15. In a particular embodiment o is from 3 to 10, in another embodiment o is from 10 to 20.

In a preferred embodiment $D^{L1}$ is selected from ethanediyl, propanediyl, butanediyl, pentanediyl, hexanediyl, heptanediyl, octanediyl, nonanediyl, or decanediyl. Most preferably $D^{L1}$ is selected from ethanediyl, 1,3-propanediyl, 1,4-butanediyl, and 1,6-hexanediyl.

In another preferred embodiment, $D^{L1}$ is a divalent $C_5$ to $C_{10}$ aryl or heteroaryl group. Most preferably $D^{L1}$ is selected from a divalent phenyl or pyridyl group.

Dicarboxylic acids which are particularly useful to prepare the leveling agents are oxalic acid (ethanedioic acid), malonic acid (propanedioic acid), succinic acid (butanedioic acid), tartaric acid (2,3-dihydroxybutanedioic acid), maleic acid ((Z)-butenedioic acid), itaconic acid (2-methylidenebutanedioic acid), glutaric acid (pentanedioic acid), adipic acid (hexanedioic acid), suberic acid (octanedioic acid), sebacic acid (decanedioic acid), iminodiacetic acid, aspartic acid (2-aminobutanedioic acid), glutamic acid, and mixtures thereof. The dicarboxylic acids can be used in the form of the free acids or as carboxylic acid derivatives, such as anhydrides, esters, amides or acid halides, in particular chlorides. Examples of such derivatives are anhydrides, such as maleic anhydride, succinic anhydride, phthalic anhydride and itaconic anhydride; adipic dichloride; esters with, preferably, $C_1$-$C_2$-alcohols, such as dimethyl adipate, diethyl adipate, dimethyl tartrate and dimethyl iminodiacetate; amides, such as adipic acid diamide, adipic acid monoamide and glutaric acid diamide. Preference is given to using the free carboxylic acids or the carboxylic acid anhydrides.

The amine compound 'a' form two amine fragments A and A' of formula L3a

(L3a)

or of Formula L3b

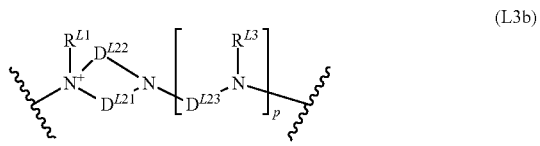
(L3b)

Herein the primary or secondary amine functional groups of both amine compounds are bound to the carbonyl functionality of the diacid, respectively.

In a first embodiment of formula L3a the divalent group $D^{L2}$ is selected from a linear or branched $C_1$ to $C_{10}$ alkanediyl, which may optionally be interrupted by $NR^{L10}$, O or S, or substituted by one or more, preferably 1 or 2 groups $NR^{L10}R^{L1}$ or $OR^{L10}$ wherein $R^{L10}$, $R^{L11}$ are independently selected from H and $C_1$-$C_{10}$ alkyl, more preferably from H and $C_1$-$C_4$ alkyl, most preferably from H, methyl or ethyl. $R^{L1}$ and $R^{L2}$ are independently selected from a $C_1$ to $C_6$ alkyl, preferably methyl, ethyl or propyl. $R^{L3}$ is selected form H and a $C_1$ to $C_6$ alkyl, preferably H or methyl. In a particularly preferred embodiment $D^{L2}$ is selected from a linear or branched $C_1$ to $C_6$ alkanediyl. Even more preferably $D^{L2}$ is selected from $(CH_2)_g$, wherein g is an integer from 1 to 6, preferably 1 to 3. Most preferably $D^{L2}$ is 1,2-ethanediyl or 1,3-propanediyl.

In a second embodiment of formula L3a the divalent group $D^{L2}$ is selected from $-D^{L11}-Ar^{L11}-D^{L11}$ wherein $D^{L11}$ is selected from a $C_1$-$C_6$-alkanediyl, preferably methanediyl or ethanediyl, and $Ar^{L11}$ is a $C_6$ to $C_{10}$ aromatic moiety, preferably phenylene, most preferably p-phenylene.

In formula L3b the divalent groups $D^{L21}$ and $D^{L22}$ are (a) independently selected from a linear or branched $C_1$ to $C_6$ alkanediyl, preferably methanediyl, ethanediyl or propanediyl, or (b) $D^{L21}$ and $D^{L22}$ are both, together with the adjacent two N atoms, part of a 5 or 6-membered aromatic heterocyclic ring system. $D^{L23}$ is a $C_1$ to $C_6$ alkanediyl. $R^{L1}$ is selected from a $C_1$ to $C_6$ alkyl, preferably methyl, ethyl or propyl. $R^{L3}$ is selected form H and a $C_1$ to $C_6$ alkyl, preferably H or methyl, most preferably H. p is 1 in case of alternative b) above (aromatic amine) and may be 0 or 1, preferably 1 in case of alternative (a) above (aliphatic cyclic system). If p is 1 the coupling agent Z is connected to a primary or secondary amine functional group; if p is 0 the coupling agent Z is connected to the secondary amine functional group that is part of the aliphatic ring system.

Since the amine fragments A and A' are positively charged, counterion $Y^{y-}$ are required to neutralize the whole composition, wherein y is a positive integer. Such counter ions may be selected from halide, particularly chloride, methane sulfonate, sulfate or acetate.

In a first preferred embodiment of formula L3b $D^{L21}$ and $D^{L22}$ are independently selected from a linear or branched $C_1$ to $C_4$ alkanediyl. Even more preferably $D^{L21}$ and $D^{L22}$ are selected from $(CH_2)_g$, wherein g is an integer from 1 to 6, preferably 1 to 3. Most preferably $D^{L21}$ and $D^{L22}$ are both ethanediyl, or $D^{L21}$ is methanediyl and $D^{L22}$ is propanediyl.

In a second preferred embodiment of formula L3b $D^{L21}$ and $D^{L22}$ together with the two adjacent N atoms, form an imidazole ring.

The coupling agent 'z' forms the coupling fragment Z of formula L4

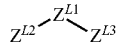

(L4)

wherein
$Z^{L1}$ is selected from
(a) a linear or branched $C_1$ to $C_{12}$ alkanediyl, which may be interrupted by one or more O atoms, preferably a $C_1$ to $C_6$ alkanediyl, which may be interrupted by 1 or two O atoms; or
(b) a divalent group $-D^{L11}-Ar^{L11}-D^{L11}-$;
$Z^{L2}$, $Z^{L3}$ are independently selected from a chemical bond or hydroxyethanediyl.

In a first preferred embodiment $Z^{L1}$ is selected from a $C_1$ to $C_{12}$ alkanediyl, preferably a $C_1$ to $C_4$ alkanediyl, most preferably methanediyl or ethanediyl. In a second preferred embodiment $Z^{L1}$ is selected from a alkylether or polyalkylether group of formula $-(D^{L10}-O-]_oD^{L10}-$, particularly a bis(2-ethanediyl)ether group, wherein $D^{L10}$ is selected from a $C_1$-$C_6$-alkanediyl, preferably a $C_1$-$C_4$-alkanediyl, most preferably ethanediyl or propanediyl and o is an integer of from 1 to 100, preferably of from 1 to 20, most preferably from 1 to 10. In a particular embodiment o is from 1 to 5, in another embodiment o is from 5 to 15. In a third preferred embodiment $Z^{L1}$ is selected from a divalent group $-D^{L11}-Ar^{L11}-D^{L11}-$, particularly a biphenyl group, wherein $D^{L11}$ is selected from a $C_1$-$C_6$-alkanediyl, preferably methanediyl or ethanediyl, and $Ar^{L11}$ is a $C_6$ to $C_{12}$ aromatic moiety, preferably phenylene and biphenylene.

In another preferred embodiment $Z^{L2}$ is selected from a chemical bond and $Z^{L3}$ is selected from hydroxyethanediyl. In yet another preferred embodiment both $Z^{L2}$ and $Z^{L3}$ are selected from a chemical bond.

Such coupling fragments Z are received from coupling agents comprising a leaving group such as but not limited to halogen, particularly Cl or Br, and/or an epoxy group.

Particularly preferred coupling agents 'z' are selected from bis(2-chloroethyl)ether; bis(2-chloro-ethoxy)ethane; epichlorohydrine, 1,ω-dihalo($C_2$-$C_{10}$)alkanes, such as but not limited to 1,3-dichloro propane, 1,4-dichloro butane, 1,5-dichloro pentane, and 1,6-dichlorohexane; bis(2-chloroethyl)ether, di(haloalkyl)aryl groups such as but not limited to xylylene dichloride and 4,4'-bis(bromomethyl)biphenyl. Herein chloride or bromide may be exchanged by other leaving groups, such as but not limited to triflate, tosylate, mesylate.

In formula L1 n is an integer of from 1 to 400, preferably of from 2 to 200, more preferably from 2 to 150. In a particular embodiment n is an integer from 2 to 50, in another embodiment n is 50 to 150.

m is 0 or, if a co-monomer is present, an integer from 1 to 400, preferably of from 1 to 200, more preferably from 2 to 150.

If a comonomer is use, the ratio of n to m may be of from 10:90 to 95:5, preferably from 20:70 to 90:10, more preferably from 30:70 to 70:30.

Generally, the mass average molecular weight $M_w$ of the leveling agent may be from about 450 to about 150000 g/mol, preferably 1000 to 80000 g/mol, most preferably 1000 to 50000 g/mol.

A first preferred embodiment of a leveler according to the present invention is a coupled aminoamide of formula L5

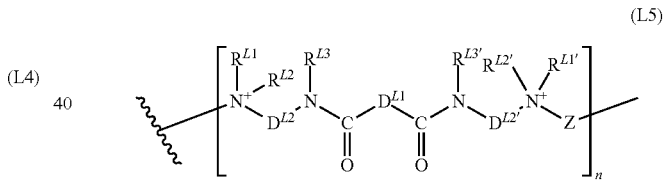

(L5)

Herein $D^{L2}$ is selected from a linear or branched $C_1$ to $C_{10}$ alkanediyl, which may optionally be interrupted by one or more O. $R^{L1}$ and $R^{L2}$ are independently selected from a $C_1$ to $C_6$ alkyl, preferably methyl, ethyl or propyl. $R^{L3}$ is selected form H and a $C_1$ to $C_6$ alkyl, preferably H or methyl. In a particularly preferred embodiment $D^{L2}$ is selected from a linear or branched $C_1$ to $C_6$ alkanediyl. Even more preferably $D^{L2}$ is selected from $(CH_2)_g$, wherein g is an integer from 1 to 6, preferably 1 to 3. Most preferably $D^{L2}$ is 1,2-ethanediyl or 1,3-propanediyl. In another preferred embodiment, the $C_1$ to $C_{10}$ alkanediyl is interrupted by O; a corresponding etheramine may be but is not limited to 2-(2-aminoethoxy)-N,N-dimethylethane amine. In yet another preferred embodiment, the $C_1$ to $C_{10}$ alkanediyl is interrupted by $NR^{L10}$; a corresponding triamine may be but is not limited to N1-(2-aminoethyl)-N1,N2,N2-trimethyl-1, 2-ethane diamine; In yet another preferred embodiment, the $C_1$ to $C_{10}$ alkanediyl is interrupted by S; a corresponding thioamine may be but is not limited to 2-[(2-aminoethyl)thio]-N,N-dimethylethaneamine.

A second preferred embodiment of a leveler according to the present invention is a coupled aminoamide of formula L6

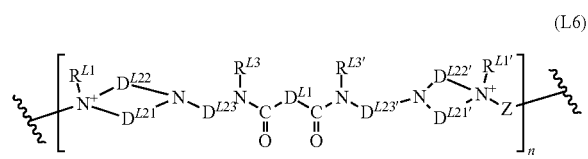
(L6)

Herein the divalent groups $D^{L21}$ and $D^{L22}$ are (a) independently selected from a linear or branched $C_1$ to $C_6$ alkanediyl, preferably methanediyl, ethanediyl or propanediyl, or (b) $D^{L21}$ and $D^{L22}$ are both, together with the adjacent two N atoms, part of a 5 or 6-membered aromatic heterocyclic ring system. $D^{L23}$ is a $C_1$ to $C_6$ alkanediyl. $R^{L1}$ is selected from a $C_1$ to $C_6$ alkyl, preferably methyl, ethyl or propyl. $R^{L3}$ is selected form H and a $C_1$ to $C_6$ alkyl, preferably H or methyl, most preferably H.

The aminoamide polymers described herein are usually terminated by tertiary amine groups or the partly reacted coupling agents 'z'.

Aliphatic tertiary amines which are particularly useful for preparing the leveling agents of formula L5 are N',N'-di(C1-C6)alkyl(C1 to C12)alkane-1,ω-diamines, such as but not limited to N',N'-dimethylethane-1,2-diamine, N',N'-dimethylpropane-1,2-diamine, N',N'-dimethylbutane-1,2-diamine, or N',N'-dimethylhexane-1,2-diamine. Aromatic tertiary amines which are particularly useful for preparing the leveling agents of formula L5 are dimethyl-p-phenylene diamine and diethyl-p-phenylene diamine.

Tertiary amines which are particularly useful for preparing the leveling agents of formula L6 are
(i) ($C_1$-$C_{12}$)alkylamine substituted 6 membered aliphatic heterocyclic moieties like 2-(4-alkylpiperazin-1-yl)alkylamines, such as but not limited to 2-(4-methylpiperazin-1-yl)ethanamine, 2-(4-methylpiperazin-1-yl)propaneamine, 2-(4-methylpiperazin-1-yl)butaneamine, or 2-(4-methylpiperazin-1-yl)hexanamine; or
(ii) ($C_1$-$C_{12}$)alkylamine substituted 5 membered aliphatic heterocyclic moieties like 2-(3-alkylimidazolidin-1-yl)alkylamine, such as but not limited to 2-(3-methylimidazolidin-1-yl)ethanamine, 2-(3-methylimidazolidin-1-yl)propanamine, 2-(3-methylimidazolidin-1-yl)butanamine, or 2-(3-methylimidazolidin-1-yl)hexanamine.

Tertiary amines which are particularly useful for preparing the leveling agents of formula L6 are 1-(ω-amino($C_1$-$C_{12}$)alkyl)imidazoles, such as but not limited to 1-(2-aminoethyl)imidazole, 1-(3-aminopropyl)imidazole, and 1-(3-aminopropyl)pyridine.

Particularly preferred homocondensates are

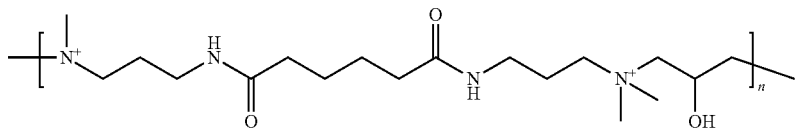

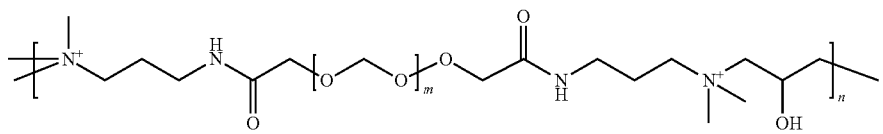

wherein m is 5 or 15.

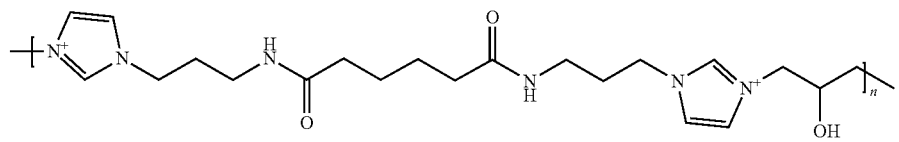

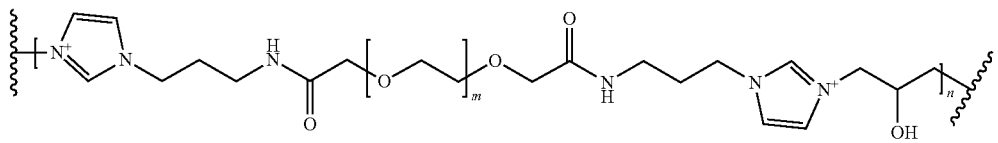

In a third embodiment of formula L1 m is equal to or greater than 1 and Y in is an amine co-monomer fragment received when an amine co-monomer 'y' comprising at least two tertiary or secondary amino groups is co-coupled together with the aminoamide compound. This co-coupling may be performed in mixture or in sequence in any order. Preferred is a co-coupling from a mixture comprising the aminoamide and the amine co-monomer.

Y may be a fragment of formula L3a or formula L3b. In this case Y may be the same or different from A and A'. Alternatively, Y may be other fragments disclosed on page 6 of US 2016/0076160 A1 (independent of its counter ion Cl⁻), which are incorporated herein by reference.

Particular preferred fragments Y are those received by reaction of 1-(Bis(3-dimethylamino)propyl)amino)-2-propanol, 4,4-trimethylenedipiperidine, tetramethyl-1,2 ethylenediamine, tetramethyl-1,3 propanediamine, tetramethyl-1,4 butanediamine, tetramethyl-1,6 hexanediamine, tetramethyl-1,8 octanediamine, tetraethyl-1,3 propanediamine, tetramethyl phenylenediamine, bis(dimethylaminoethyl)ether, tetramethyl-2-butene-1,4-diamine, tetramethyl-2,2-dimethyl-1,3 propanediamine. By using a co-monomer, the properties of the additive may be further influenced, e.g. by increasing or decreasing nitrogen-content, hydrophilicity, charge and charge density or other chemical or physical properties.

Particularly preferred co-condensates are

The reaction can be carried out in a suitable solvent or preferably in the absence of a solvent. If a solvent is used, suitable examples are hydrocarbons, such as toluene or xylene, nitriles, such as acetonitrile, amides, such as N,N-dimethylformamide, N,N-dimethylacetamide, N-methylpyrrolidone, ethers, such as diethylene glycol dimethyl ether, ethylene glycol dimethyl ether, ethylene carbonate, propylene carbonate and the like. The solvent is generally distilled off during the reaction or when the reaction is complete. This distillation can optionally be carried out under a protective gas, such as nitrogen or argon.

In general, the total amount of leveling agents in the electroplating bath is from 0.05 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

A large variety of additives may typically be used in the bath to provide desired surface finishes for the Cu plated metal. Usually more than one additive is used with each additive forming a desired function. Advantageously, the electroplating baths may contain one or more of accelerators, suppressors, sources of halide ions, grain refiners and mixtures thereof. Most preferably the electroplating bath

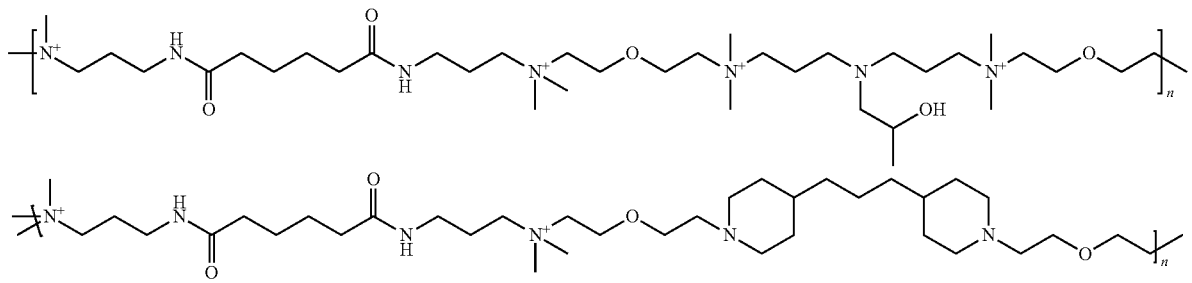

The condensation of the amine and the dicarboxylic acid usually takes place by heating the amine and the dicarboxylic acid, e.g. to temperatures of from 100 to 250 degrees C., preferably 120 to 200 degrees C., and distilling off the water of reaction which forms in the condensation. If said carboxylic acid derivatives are used, the condensation can also be carried out at temperatures lower than those given. The preparation of the cationic aminoamide polymers can be carried out without the addition of a catalyst, or alternatively with the use of an acidic or basic catalyst. Suitable acidic catalysts are, for example, acids, such as Lewis acids, e.g. sulfuric acid, p-toluenesulfonic acid, phosphorous acid, hypophosphorous acid, phosphoric acid, methanesulfonic acid, boric acid, aluminum chloride, boron trifluoride, tetraethyl orthotitanate, tin dioxide, tin butyldilaurate or mixtures thereof. Suitable basic catalysts are, for example, alkoxides, such as sodium methoxide or sodium ethoxide, alkali metal hydroxides, such as potassium hydroxide, sodium hydroxide or lithium hydroxide, alkaline earth metal oxides, such as magnesium oxide or calcium oxide, alkali metal and alkaline earth metal carbonates, such as sodium, potassium and calcium carbonate, phosphates, such as potassium phosphate and complex metal hydrides, such as sodium borohydride. Where used, the catalyst is generally used in an amount of from 0.05 to 10% by weight, preferably 0.5 to 1% by weight, based on the total amount of the starting materials.

contains both, an accelerator and a suppressor in addition to the leveling agent according to the present invention.

Other Additives

A large variety of further additives may typically be used in the bath to provide desired surface finishes for the Cu plated metal. Usually more than one additive is used with each additive forming a desired function. Advantageously, the electroplating baths may contain one or more of accelerators, suppressors, sources of halide ions, grain refiners and mixtures thereof. Most preferably the electroplating bath contains both, an accelerator and a suppressing agent in addition to the leveling agent according to the present invention. Other additives may also be suitably used in the present electroplating baths.

Accelerators

Any accelerators may be advantageously used in the plating baths according to the present invention. As used herein, "accelerator" refers to an organic additive that increases the plating rate of the electroplating bath. The terms "accelerator" and "accelerating agent" are used interchangeably throughout this specification. In literature, sometimes the accelerator component is also named "brightener", "brightening agent", or "depolarizer". Accelerators useful in the present invention include, but are not limited to, compounds comprising one or more sulphur atom and a sulfonic/phosphonic acid or their salts. Preferably the composition further comprises at least one accelerating agent.

Preferred accelerators have the general structure $MO_3Y^A—X^{A1}—(S)_dR^{A2}$, with:

M is a hydrogen or an alkali metal, preferably Na or K;
$Y^A$ is P or S, preferably S;
d is an integer from 1 to 6, preferably 2;
$X^{A1}$ is selected from a $C_1$-$C_8$ alkanediyl or heteroalkanediyl group, a divalent aryl group or a divalent heteroaromatic group. Heteroalkyl groups will have one or more heteroatom (N, S, O) and 1-12 carbons. Carbocyclic aryl groups are typical aryl groups, such as phenyl or naphthyl. Heteroaromatic groups are also suitable aryl groups and contain one or more N, O or S atom and 1-3 separate or fused rings.
$R^{A2}$ is selected from H or (—S—$X^{A1'}Y^AO_3M$), wherein $X^{A1'}$ is independently selected from group $X^{A1}$.

More specifically, useful accelerators include those of the following formulae:

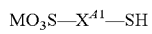

$MO_3S—X^{A1}—SH$

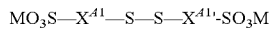

$MO_3S—X^{A1}—S—S—X^{A1'}-SO_3M$

$MO_3S—Ar—S—S—Ar—SO_3M$ wherein $X^{A1}$ is as defined above and Ar is aryl.

Particularly preferred accelerating agents are:
SPS: bis-(3-sulfopropyl)-disulfide
MPS: 3-mercapto-1-propansulfonic acid.

Both are usually applied in form of their salts, particularly their sodium salts.

Other examples of accelerators, used alone or in mixture, include, but are not limited to: MES (2-Mercaptoethanesulfonic acid, sodium salt); DPS (N,N-dimethyldithiocarbamic acid (3-sulfopropylester), sodium salt); UPS (3-[(amino-iminomethyl)-thio]-1-propylsulfonic acid); ZPS (3-(2-benzthiazolylthio)-1-propanesulfonic acid, sodium salt); 3-mercapto-propylsulfonicacid-(3-sulfopropyl)ester; methyl-(o-sulphopropyl)-disulfide, disodium salt; methyl-(o-sulphopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Suppressing Agents

Suppressing agents may advantageously used in combination with the levelers according to the present inventions. As used herein, "suppressing agents" are additives which increase the overpotential during electrodeposition. There terms "surfactant" and "suppressing agent" are synonymously used since the suppressing agents described herein are also surface-active substances.

Particularly useful suppressing agents are:
(a) Suppressing agents obtainable by reacting an amine compound comprising at least three active amino functional groups with a mixture of ethylene oxide and at least one compound selected from $C_3$ and $C_4$ alkylene oxides as described in WO 2010/115796.

Preferably the amine compound is selected from diethylene triamine, 3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

(b) Suppressing agents obtainable by reacting an amine compound comprising active amino functional groups with a mixture of ethylene oxide and at least one compound selected from $C_3$ and $C_4$ alkylene oxides, said suppressing agent having a molecular weight $M_w$ of 6000 g/mol or more, forming an ethylene $C_3$ and/or $C_4$ alkylene random copolymer as described in WO 2010/115756.

(c) Suppressing agent obtainable by reacting an amine compound comprising at least three active amino functional groups with ethylene oxide and at least one compound selected from $C_3$ and $C_4$ alkylene oxides from a mixture or in sequence, said suppressing agent having a molecular weight $M_w$ of 6000 g/mol or more as described in WO 2010/115757.

Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxyatridecane-1,13-diamine, triethylene glycol diamine, diethylene triamine, (3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

(d) Suppressing agent selected from compounds of formula S1

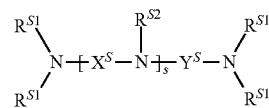

(S1)

wherein the $R^{S1}$ radicals are each independently selected from a copolymer of ethylene oxide and at least one further $C_3$ to $C_4$ alkylene oxide, said copolymer being a random copolymer, the $R^{S2}$ radicals are each independently selected from $R^{S1}$ or alkyl, $X^S$ and $Y^S$ are spacer groups independently, and $X^S$ for each repeating unit s independently, selected from $C_2$ to $C_6$ alkandiyl and $Z^S$—(O—$Z^S$)$_t$ wherein the $Z^S$ radicals are each independently selected from $C_2$ to $C_6$ alkandiyl, s is an integer equal to or greater than 0, and t is an integer equal to or greater than 1, as described in WO 2010/115717.

Preferably spacer groups $X^S$ and $Y^S$ are independently, and $X^S$ for each repeating unit independently, selected from $C_2$ to $C_4$ alkylene. Most preferably $X^S$ and $Y^S$ are independently, and $X^S$ for each repeating unit s independently, selected from ethylene (—$C_2H_4$—) or propylene (—$C_3H_6$—).

Preferably $Z^S$ is selected from $C_2$ to $C_4$ alkylene, most preferably from ethylene or propylene.

Preferably s is an integer from 1 to 10, more preferably from 1 to 5, most preferably from 1 to 3. Preferably t is an integer from 1 to 10, more preferably from 1 to 5, most preferably from 1 to 3.

In another preferred embodiment the $C_3$ to $C_4$ alkylene oxide is selected from propylene oxide (PO). In this case EO/PO copolymer side chains are generated starting from the active amino functional groups The content of ethylene oxide in the copolymer of ethylene oxide and the further $C_3$ to $C_4$ alkylene oxide can generally be from about 5% by weight to about 95% by weight, preferably from about 30% by weight to about 70% by weight, particularly preferably between about 35% by weight to about 65% by weight.

The compounds of formula (S1) are prepared by reacting an amine compound with one ore more alkylene oxides. Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxatridecane-1,13-diamine, triethylene glycol diamine, diethylene triamine, (3-(2-aminoethyl)amino)propylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

The molecular weight $M_w$ of the suppressing agent of formula S1 may be between about 500 g/mol to about 30000 g/mol. Preferably the molecular weight $M_w$ should be about 6000 g/mol or more, preferably from about 6000 g/mol to about 20000 g/mol, more preferably from about 7000 g/mol to about 19000 g/mol, and most preferably from about 9000 g/mol to about 18000 g/mol. Preferred total amounts of alkylene oxide units in the suppressing agent may be from about 120 to about 360, preferably from about 140 to about 340, most preferably from about 180 to about 300.

Typical total amounts of alkylene oxide units in the suppressing agent may be about 110 ethylene oxide units (EO) and 10 propylene oxide units (PO), about 100 EO and 20 PO, about 90 EO and 30 PO, about 80 EO and 40 PO, about 70 EO and 50 PO, about 60 EO and 60 PO, about 50 EO and 70 PO, about 40 EO and 80 PO, about 30 EO and 90 PO, about 100 EO and 10 butylene oxide (BO) units, about 90 EO and 20 BO, about 80 EO and 30 BO, about 70 EO and 40 BO, about 60 EO and 50 BO or about 40 EO and 60 BO to about 330 EO and 30 PO units, about 300 EO and 60 PO, about 270 EO and 90 PO, about 240 EO and 120 PO, about 210 EO and 150 PO, about 180 EO and 180 PO, about 150 EO and 210 PO, about 120 EO and 240 PO, about 90 EO and 270 PO, about 300 EO and 30 BO units, about 270 EO and 60 BO, about 240 EO and 90 BO, about 210 EO and 120 BO, about 180 EO and 150 BO, or about 120 EO and 180 BO.

(e) Suppressing agent obtainable by reacting a polyhydric alcohol condensate compound derived from at least one polyalcohol of formula (S2) $X^S(OH)_u$ by condensation with at least one alkylene oxide to form a polyhydric alcohol condensate comprising polyoxyalkylene side chains, wherein u is an integer from 3 to 6 and $X^S$ is an u-valent linear or branched aliphatic or cycloaliphatic radical having from 3 to 10 carbon atoms, which may be substituted or unsubstituted, as described in WO 2011/012462.

Preferred polyalcohol condensates are selected from compounds of formulae

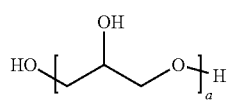
(S2a)

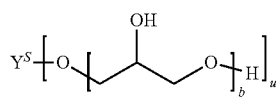
(S2b)

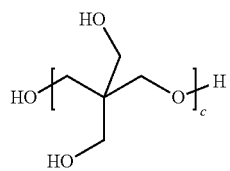
(S2c)

wherein $Y^S$ is an u-valent linear or branched aliphatic or cycloaliphatic radical having from 1 to 10 carbon atoms, which may be substituted or unsubstituted, a is an integer from 2 to 50, b may be the same or different for each polymer arm u and is an integer from 1 to 30, c is an integer from 2 to 3, and u is an integer from 1 to 6. Most preferred Polyalcohols are glycerol condensates and/or pentaerythritol condensates.

(f) Suppressing agent obtainable by reacting a polyhydric alcohol comprising at least 5 hydroxyl functional groups with at least one alkylene oxide to form a polyhydric alcohol comprising polyoxyalkylene side chains as described in WO 2011/012475. Preferred polyalcohols are linear or cyclic monosaccharide alcohols represented by formula (S3a) or (S3b)

$$HOCH_2-(CHOH)_v-CH_2OH \quad (S3a)$$

$$(CHOH)_w \quad (S3b)$$

wherein v is an integer from 3 to 8 and w is an integer from 5 to 10. Most preferred monosaccharide alcohols are sorbitol, mannitol, xylitol, ribitol and inositol. Further preferred polyalcohols are monosaccharides of formula (S4a) or (S4b)

$$CHO-(CHOH)_x-CH_2OH \quad (S4a)$$

$$CH_2OH-(CHOH)_y-CO-(CHOH)_z-CH_2OH \quad (S4b)$$

wherein x is an integer of 4 to 5, and y, z are integers and y+z is 3 or 4. Most preferred monosaccharide alcohols are selected from the aldoses allose, altrose, galactose, glucose, gulose, idose, mannose, talose, glucoheptose, mannoheptose or the ketoses fructose, psicose, sorbose, tagatose, mannoheptulose, sedoheptulose, taloheptulose, alloheptulose.

(g) amine-based polyoxyalkylene suppressing agents based on cyclic amines show extraordinary superfilling properties, as described in WO 2018/073011.

(h) polyamine-based or polyhydric alcohol-based suppressing agents which are modified by reaction with a compound, such as but not limited to glycidole or glycerol carbonate, that introduce a branching group into the suppressing agent before they are reacted with alkylene oxides show extraordinary superfilling properties, as described in WO 2018/114985.

When suppressors are used, they are typically present in an amount in the range of from about 1 to about 10,000 ppm based on the weight of the bath, and preferably from about 5 to about 10,000 ppm.

It will be appreciated by those skilled in the art that more than one leveling agent may be used. When two or more leveling agents are used, at least one of the leveling agents is a leveling agent according to the invention or a derivative thereof as described herein. It is preferred to use only one leveling agent in the plating composition.

Further Leveling Agents

Additional leveling agents can advantageously be used in the copper electroplating baths according to the present invention. When two or more leveling agents are used, at least one of the leveling agents is a polyalkoxylated polyalkyleneimine or a derivative thereof as described herein. It is preferred to use only one leveling agent in the plating composition that is a polyalkoxylated polyalkylenepolyamine according to the invention.

Suitable additional leveling agents include, but are not limited to, one or more of other polyethylene imines and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole as described e.g. in WO 2011/151785 A1, polyvinylpyrrolidone, polyaminoamides as described e.g. in WO 2011/064154 A2 and WO 2014/072885 A2, or copolymers thereof, nigrosines, pentamethyl-para-rosaniline hydrohalide, hexamethyl-pararosaniline hydrohalide, di- or trialkanolamines and their derivatives as described in WO 2010/069810, biguanides as described in WO 2012/085811 A1, or a compound containing a functional group of the formula N—R—S, where R is a substituted alkyl, unsubstituted alkyl, substituted aryl or unsubstituted aryl. Typically, the alkyl groups are $C_1$-$C_6$ alkyl and preferably $C_1$-$C_4$ alkyl. In general, the aryl groups include $C_6$-$C_{20}$ aryl, preferably $C_6$-$C_{10}$ aryl. It is preferred that the aryl group is phenyl or naphthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, $C_1$-$C_{12}$ alkyl, $C_2$-$C_{12}$ alkenyl, $C_6$-$C_{20}$ aryl, $C_1$-$C_{12}$ alkylthio, $C_2$-$C_{12}$ alkenylthio, $C_6$-$C_{20}$ arylthio and the like. Likewise, the nitrogen will have one or more substituent groups, such as but not limited to hydrogen, $C_1$-$C_{12}$ alkyl, $C_2$-$C_{12}$ alkenyl, $C_7$-$C_{10}$ aryl, and the like. The N—R—S functional group may be acyclic or cyclic. Compounds containing cyclic N—R—S functional groups include those having either the nitrogen or the sulfur or both the nitrogen and the sulfur within the ring system.

In general, the total amount of leveling agents in the electroplating bath is from 0.5 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

More details and alternatives are described in WO 2018/219848, WO 2016/020216, and WO 2010/069810, respectively, which are incorporated herein by reference.

In general, the total amount of leveling agents in the electroplating bath is from 0.5 ppm to 10000 ppm based on the total weight of the plating bath. The leveling agents according to the present invention are typically used in a total amount of from about 100 ppm to about 10000 ppm based on the total weight of the plating bath, although greater or lesser amounts may be used.

Electrolyte

The electroplating composition according to the present invention comprises and electrolyte comprising copper ions and an acid.

Copper Ions

The source of copper ions may be any compound capable of releasing metal ions to be deposited in the electroplating bath in sufficient amount, i.e. is at least partially soluble in the electroplating bath. It is preferred that the metal ion source is soluble in the plating bath. Suitable metal ion sources are metal salts and include, but are not limited to, sulfates, halides, acetates, nitrates, fluoroborates, alkylsulfonates, arylsulfonates, sulfamates, metal gluconates and the like.

The metal ion source may be used in the present invention in any amount that provides sufficient metal ions for electroplating on a substrate. When the metal is solely copper, it is typically present in an amount in the range of from about 1 to about 300 g/l of plating solution, preferably from about 20 to about 100 g/l, most preferably from about 40 to about 70 g/l.

Optionally, the plating baths according to the invention may contain one or more alloying metal ions up to an amount of 10% by weight, preferably up to 5% by weight, most preferably up to 2% by weight. Suitable alloying metals include, without limitation, silver, gold, tin, bismuth, indium, zinc, antimony, manganese and mixtures thereof. Preferred alloying metals are silver, tin, bismuth, indium, and mixtures thereof, and more preferably tin. Any bath-soluble salt of the alloying metal may suitably be used as the source of alloying metal ions. Examples of such alloying metal salts include but are not limited to: metal oxides; metal halides; metal fluoroborate; metal sulfates; metal alkanesulfonates such as metal methanesulfonate, metal ethanesulfonate and metal propanesulfonate; metal arylsulfonates such as metal phenylsulfonate, metal toluenesulfonate, and metal phenolsulfonate; metal carboxylates such as metal gluconate and metal acetate; and the like. Preferred alloying metal salts are metal sulfates; metal alkanesulfonates; and metal arylsulfonates. When one alloying metal is added to the present compositions, a binary alloy deposit is achieved. When 2, 3 or more different alloying metals are added to the present compositions, tertiary, quaternary or higher order alloy deposits are achieved. The amount of such alloying metal used in the present compositions will depend upon the particular tin-alloy desired. The selection of such amounts of alloying metals is within the ability of those skilled in the art. It will be appreciated by those skilled in the art that when certain alloying metals, such as silver, are used, an additional complexing agent may be required. Such complexing agents (or complexers) are well-known in the art and may be used in any suitable amount to achieve the desired tin-alloy composition.

In a preferred embodiment the plating solution is essentially free of tin, that is, they contain below 1% by weight tin, more preferably below 0.1% by weight tin, and yet more preferably below 0.01% by weight tin, and still more preferably are free of tin. In another preferred embodiment the plating solution is essentially free of any alloying metal, that is, they contain below 1% by weight alloying metal, more preferably below 0.1% by weight alloying metal, even more preferably below 0.01% by weight alloying metal, and still more preferably are free of alloying metal. Most preferably the metal ions consist of copper ions, i.e. are free of any other ions besides copper.

The present electroplating compositions are suitable for depositing a copper-containing layer, which may preferably be a pure copper layer or alternatively a copper alloy layer comprising up to 10% by weight, preferably up to 5% by weight, most preferably up to 2% by weight of the alloying metal(s). Exemplary copper alloy layers include, without limitation, tin-silver, tin-copper, tin-indium, tin-bismuth, tin-silver-copper, tin-silver-copper-antimony, tin-silver-copper-manganese, tin-silver-bismuth, tin-silver-indium, tin-silver-zinc-copper, and tin-silver-indium-bismuth. Preferably, the present electroplating compositions deposit pure tin, tin-silver, tin-silver-copper, tin-indium, tin-silver-bismuth, tin-silver-indium, and tin-silver-indium-bismuth, and more preferably pure tin, tin-silver or tin-copper.

The alloy metal content may be measured by either atomic adsorption spectroscopy (AAS), X-ray fluorescence (XRF), inductively coupled plasma mass spectrometry (ICP-MS).

In general, besides the copper ions and at least one of the leveling agents, the present copper electroplating compositions preferably include an electrolyte, i. e. acidic or alkaline electrolyte, optionally halide ions, and optionally other additives like accelerators and suppressing agents.

Such baths are typically aqueous. In general, as used herein "aqueous" means that the present electroplating compositions comprises a solvent comprising at least 50% of water. Preferably, "aqueous" means that the major part of the composition is water, more preferably 90% of the solvent is water, most preferably the solvent consists or essentially consists of water. Any type of water may be used, such as distilled, deinonized or tap.

Acid

The plating baths of the invention are acidic, that is, they have a pH below 7. Typically, the pH of the copper electroplating composition is below 4, preferably below 3, most preferably below 2. The pH mainly depends on the concentration of the acid present in the composition.

Suitable acids include inorganic acids and organic acids, such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, and phosphoric acid. Sulfuric acid and methanesulfonic acid are preferred.

The acids are typically present in an amount in the range of from about 1 to about 300 g/l, preferably from about 60 to about 200 g/l, most preferably from about 80 to about 140 g/l.

Such electrolytes may optionally (and preferably) contain a source of halide ions, such as chloride ions as in copper chloride or hydrochloric acid. A wide range of halide ion concentrations may be used in the present invention such as from about 0 to about 500 ppm. Preferably, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

Process

The composition according to the invention is particularly useful for electrodepositing copper on a substrate comprising a recessed feature comprising a conductive feature bottom and a dielectric feature side wall, wherein the recessed feature has an aperture size from 500 nm to 500 µm. The leveling agents according to the present invention are particularly useful for filling of recessed features having aperture sizes of 1 to 200 µm. The leveling agents are particularly useful for depositing copper bumps.

The copper is deposited in recesses according to the present invention without substantially forming voids within the metal deposit. By the term "without substantially forming voids", it is meant that there are no voids in the metal deposit which are bigger than 1000 nm, preferably no voids in the metal deposit which are bigger than 500 nm, most preferably no voids in the metal deposit which are bigger than 100 nm. Most preferably the deposit is free of any defects.

Due to the leveling effect of the leveling agents, surfaces are obtained with an improved coplanarity of the plated copper bumps. The copper deposits show a good morphology, particularly a low roughness. The electroplating composition is capable of filling recessed features on the micrometer scale without substantially forming defects, such as but not limited to voids.

Furthermore, the leveling agents according to the invention lead to reduced impurities, such as but not limited to organics, chloride, sulfur, nitrogen, or other elements. It shows large grains and an improved conductivity. It also facilitates high plating rates and allows plating at elevated temperature.

In general, when the present invention is used to deposit copper on a substrate the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Plating equipments for plating semiconductor substrates are well known. Plating equipment comprises an electroplating tank which holds copper electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings.

These additives can be used with soluble and insoluble anodes in the presence or absence of a membrane or membranes separating the catholyte from the anolyte.

The cathode substrate and anode are electrically connected by wiring and, respectively, to a power supply. The cathode substrate for direct or pulse current has a net negative charge so that the metal ions in the solution are reduced at the cathode substrate forming plated metal on the cathode surface. An oxidation reaction takes place at the anode. The cathode and anode may be horizontally or vertically disposed in the tank.

In general, when preparing copper bumps, a photoresist layer is applied to a semiconductor wafer, followed by standard photolithographic exposure and development techniques to form a patterned photoresist layer (or plating mask) having recessed features or vias therein. The dimensions of the dielectric plating mask (thickness of the plating mask and the size of the openings in the pattern) defines the size and location of the copper layer deposited over the I/O pad and UBM. The diameter of such deposits typically range of from 1 to 300 µm, preferably in the range from 2 to 100 µm. Usually the recesses provided by the plating mask are not fully but only partly filled. After filling the openings in the plating mask with copper, the plating mask is removed, and then the copper bumps are usually subjected to reflow processing.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

All percent, ppm or comparable values refer to the weight with respect to the total weight of the respective composition except where otherwise indicated. All cited documents are incorporated herein by reference.

The following examples shall further illustrate the present invention without restricting the scope of this invention.

Analytical Methods

The molecular weight of the suppressing agents was determined by size-exclusion chromatography (SEC). Polystyrene was used as standard and tetrahydrofuran as effluent. The temperature of the column was 30° C., the injected volume 30 µl (microliter) and the flow rate 1.0 ml/min. The weight average molecular weight ($M_w$), the number average molecular weight ($M_n$) and the polydispersity PDI ($M_w/M_n$) of the suppressing agent were determined.

The amine number was determined according to DIN 53176 by titration of a solution of the polymer in acetic acid with perchloric acid.

The experiments were performed by using a 300 mm silicon wafer segment with a patterned photoresist 120 µm thick and a plurality of copper seeded 75 micrometers opening vias (available from IMAT, Inc., Vancouver, WA, USA).

The electroplated copper was investigated by a 3D laser scanning microscope (3D LSM). The height of the deposited copper layer in the bumps was determined visually.

The non-uniformity was determined from heights of totally 27 measured bumps, where 15 bumps in the dense area with a pitch size of 150 µm and 12 bumps with a pitch size of 375 µm were measured.

The coplanarity, an indicator of non-uniformity, was calculated from the heights by using the following formula:

$$COP[\%] = \frac{\text{bump height average } iso - \text{bump height average dense}}{\text{mean height}} \times 100$$

wherein
"bump height average iso" and "bump height average dense" are the arithmetic mean of each area. "mean height" is calculated by the sum of "bump height average iso" and "bump height average dense" divided by 2.

EXAMPLES

Example 1: Leveler Preparation

Example 1.1

The reaction was placed in a 1.6 l reactor equipped with a stirrer, condenser tube, thermometer and nitrogen inlet pipe. 3-Aminopropyldimethylamine (415.5 g) and hypophosphoric acid (0.68 g) were placed into the reactor under nitrogen atmosphere and heated up to 80° C. Then adipinic acid (297.1 g) was added in portion over a period of 20 min. The temperature was increased up to 170° C., after complete addition of acid, and the reaction mixture was stirred over 9 hours while removing the resulting water out of the system. A pre-product was obtained as white solid with an amine value of 6.4 mmol/g (yield: 97.1%).

The pre-product (567 g) and water (921.4 g) were placed into a 2000 ml flask, heated up to 80° C. and stirred over 20 min. Then epichlorohydrine (309.2 g) was added dropwise over a period of 90 min. To complete the reaction, the mixture post-react for 24 h until the Preussmann test was negative. The product (Leveler 1) was obtained as orange, viscous solution with a chloride value of 1.75 mmol/g (yield: 98.5%).

Example 1.2

3-Aminopropyldimethylamine (81.7 g) and hypophosphoric acid (0.08 g) were placed into a 250 ml flask under nitrogen atmosphere and heated up to 80° C. Then Polyethylene glycol (250) diacid (100 g) was added in portion over 20 min. The temperature was increased up to 170° C., and the reaction mixture was stirred over 10 hours while removing the resulting water out of the system. A pre-product was obtained as yellow, viscous oil with an amine value of 4.74 mmol/g (yield: 96.3%).

The pre-product (42.2 g) and water (56 g) were placed into a 250 ml flask and heated up to 80° C. Then epichlorohydrine (8.5 g) was added dropwise over 90 min. To complete the reaction, the mixture post-react for 12 h until the Preussmann test was negative. The product (Leveler 2) was obtained as an orange, viscous liquid with a chloride value of 1.0 mmol/g and an amine value of 1.26 mmol/g (yield: 98.6%).

Example 1.3

1-(3-Aminopropyl) imidazole (187.7 g) and hypophosphoric acid (0.12 g) were placed into a 250 ml flask under nitrogen atmosphere and heated up to 80° C. Then adipinic acid (109.6 g) was added in portion over 10 min. The temperature was increased up to 170° C., and the reaction mixture was stirred over 12 hours while removing the resulting water out of the system. A pre-product was obtained as orange, viscous oil with an amine value of 5.7 mmol/g (yield: 96.3%).

The pre-product (37.9 g) and water (50 g) were placed into a 250 ml flask and heated up to 80° C. Then epichlorohydrine (9.2 g) was added dropwise over 90 min. To complete the reaction, the mixture post-react for 12 h until the Preussmann test was negative. The product (Leveler 3) was obtained as orange, viscous liquid with a chloride value of 1.0 mmol/g and an amine value of 1.26 mmol/g (yield: 94.3%).

Example 1.4

1-(3-Aminopropyl) imidazole (100.1 g) and hypophosphoric acid (0.16 g) were placed into a 250 ml flask under nitrogen atmosphere and heated up to 80° C. Then polyethylene glycol (250) diacid (100 g) was added. The temperature was increased up to 170° C., and the reaction mixture was stirred over 12 hours while removing the resulting water out of the system. A pre-product was obtained as an orange, viscous oil with an amine value of 4.5 mmol/g (yield: 95.4%).

The pre-product (48.2 g) and water (58 g) were placed into a 250 ml flask and heated up to 80° C. Then epichlorohydrine (9.2 g) was added dropwise over 90 min. To complete the reaction, the mixture post-react for 10 h until the Preussmann test was negative. The product (Leveler 4) was obtained as orange, viscous liquid with a chloridevalue of 0.9 mmol/g (yield: 94.3%).

Example 1.5

The pre-product of example 1.1 (32.3 g), 4,4'-trimethylendipiperidine (21 g) and water (200 g) were placed into a 500 ml flask. Then Bis-(2-chlorethyl) ether (26.3 g) was added dropwise over 10 min. at room temperature. The reaction mixture was heated up to 80° C. and stirred over 5 h. The product (Leveler 5) was obtained as yellow solution with a chloride value of 1.2 mmol/g (yield: 93.3%).

Example 1.6

The pre-product of example 1.1 (32.3 g), 1-[Bis[3-(dimethylamino)propyl]amino]-2-propanol (26.9 g) and water (200 g) were placed into a 500 ml flask. Then Bis-(2-chlorethyl) ether (26.3 g) was added dropwise over 10 min. at room temperature. The reaction mixture was heated up to 80° C. and stirred over 6 h. The product (Leveler 6) was obtained as orange solution with a chloride value of 1.09 mmol/g (yield: 95.8%).

Example 2: Electroplating Experiments

Example 2.1 Comparative

A copper electroplating bath containing 51 g/l Cu ions, 100 g/l sulfuric acid and 50 ppm chloride has been used for the studies. In addition, the bath contains the following additives 50 ppm SPS and 100 ppm of an ethylene oxide polymer suppressor with an average molecular weight of 4000 g/mol.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 24.7% was determined.

Example 2.2

A copper electroplating bath containing 51 g/l Cu ions, 100 g/l sulfuric acid and 50 ppm chloride has been used for the studies. In addition, the bath contains the following additives 50 ppm SPS, 100 ppm of an ethylene oxide polymer suppressor with an average molecular weight of 4000 g/mol and 20 ppm of Leveler 1 of example 1.1.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 16.0% was determined.

The results are summarized in Table 1.

Example 2.3

A copper electroplating bath containing 51 g/l Cu ions, 100 g/l sulfuric acid and 50 ppm chloride has been used for the studies. In addition, the bath contains the following additives 50 ppm SPS, 100 ppm of an ethylene oxide polymer suppressor with an average molecular weight of 4000 g/mol and 20 ppm of Leveler 2 of example 1.2.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 12.9% was determined.

Example 2.4

A copper electroplating bath containing 51 g/l Cu ions, 100 g/l sulfuric acid and 50 ppm chloride has been used for the studies. In addition, the bath contains the following additives 50 ppm SPS, 100 ppm of an ethylene oxide polymer suppressor with an average molecular weight of 4000 g/mol and 20 ppm of Leveler 3 of example 1.3.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 8.2% was determined.

Example 2.5

A copper electroplating bath containing 51 g/l Cu ions, 100 g/l sulfuric acid and 50 ppm chloride has been used for the studies. In addition, the bath contains the following additives 50 ppm SPS, 100 ppm of an ethylene oxide polymer suppressor with an average molecular weight of 4000 g/mol and 20 ppm of Leveler 4 of example 1.4.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 12.3% was determined.

Example 2.6

A copper electroplating bath containing 51 g/l Cu ions, 100 g/l sulfuric acid and 50 ppm chloride has been used for the studies. In addition, the bath contains the following additives 50 ppm SPS, 100 ppm of an ethylene oxide polymer suppressor with an average molecular weight of 4000 g/mol and 20 ppm of Leveler 5 of example 1.5.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 12.0% was determined.

Example 2.7

A copper electroplating bath containing 51 g/l Cu ions, 100 g/l sulfuric acid and 50 ppm chloride has been used for the studies. In addition, the bath contains the following additives 50 ppm SPS, 100 ppm of an ethylene oxide polymer suppressor with an average molecular weight of 4000 g/mol and 20 ppm of Leveler 6 of example 1.6.

The substrate is prewetted and electrically contacted prior plating. The copper layer was plated by using a bench top plating tool available from Yamamoto MS. The electrolyte convection was realized by a pump and a paddle in front of the substrate. The RPM of the paddle for all plating conditions were 50 RPM. Bath temperature was controlled and set to 25° C. and the applied current density was 4 ASD for 340 s and 8 ASD for 1875 s resulting in bumps of approximately 50 μm height.

The plated bumps were examined with an LSM as described in detail above. A coplanarity (COP) 10.0% was determined.

TABLE 1

| Example | Leveler | COP [%] |
| --- | --- | --- |
| 2.1 | n/a | 24.7 |
| 2.2 | [3-Aminopropyldimethylamine + adipinic acid] + Epichlorohydrine | 16.0 |
| 2.3 | [3-Aminopropyldimethylamine + Polyethylene glycol (250) diacid] + Epichlorohydrine | 12.9 |
| 2.4 | [1-(3-Aminopropyl)imidazole + adipinic acid] + Epichlorohydrine | 8.2 |
| 2.5 | [1-(3-Aminopropyl)imidazole + Polyethylene glycol (250) diacid] + Epichlorohydrine | 12.3 |
| 2.6 | [3-Aminopropyldimethylamine + adipinic acid] + 4,4'-Trimethylenedipiperidin + Bis-(2-chloroethyl)-ether | 12.0 |
| 2.7 | 1-(Bis(3-(dimethylamino)propyl)amino)-2-propanol + [3-Aminopropyldimethylamine + adipinic acid] + Bis-(2-chloroethyl)-ether | 10.0 |

Table 1 shows that all levelers lead to copper deposits that have a very good coplanarity and a much better coplanarity compared to comparative example 2.1 without leveler.

The invention claimed is:

1. A composition comprising copper ions, an acid, and at least one polyaminoamide comprising a group of formula L1

$$[A-B-A'-Z]_n[Y-Z]_m \quad (L1)$$

wherein
B is a diacid fragment of formula L2

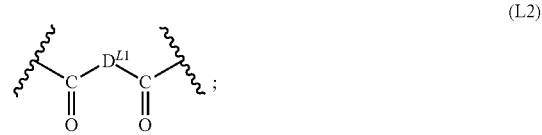

A, A' are amine fragments independently selected from the group consisting of formula L3a

and formula L3b

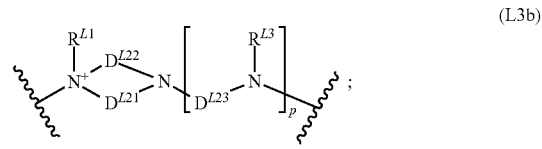

$D^{L1}$ is selected from the group consisting of
  (a) a chemical bond and
  (b) a divalent group selected from the group consisting of
    (i) $C_1$-$C_{20}$-alkanediyl which may optionally be interrupted by a double bond, an imino group or is optionally, completely or partially, a constituent of one or more saturated, unsaturated or aromatic 5- to 10-membered rings, and
    (ii) an ether or polyether group of formula L2a $$-(D^{L10}\text{-O-})_o D^{L10}- \quad (L2a);$$

$D^{L2}$ is a divalent group selected from the group consisting of
  (a) a linear or branched $C_1$ to $C_{10}$ alkanediyl, which may optionally be interrupted by $NR^{L10}$ or O, or substituted by one or more groups $NR^{L10}R^{L11}$ or $OR^{L10}$, and
  (b) $-D^{L11}-Ar^{L11}-D^{L11}-$;
$D^{L10}$ is $C_1$-$C_6$-alkanediyl;
$D^{L11}$ is a $C_1$-$C_6$-alkanediyl;
$Ar^{L11}$ is a $C_6$ to $C_{10}$ aromatic moiety;
$D^{L21}$, $D^{L22}$ are independently selected from the group consisting of a linear or branched $C_1$ to $C_6$ alkanediyl;
$D^{L23}$ is a $C_1$ to $C_6$ alkanediyl;
$R^{L1}$, $R^{L2}$ are independently selected from the group consisting of $C_1$ to $C_6$ alkyls;
$R^{L3}$ is selected from the group consisting of H and $C_1$ to $C_6$ alkyls;
Y is a co-monomer fragment;
Z is a divalent coupling fragment of formula L4

$Z^{L1}$ is selected from the group consisting of
  (a) a linear or branched $C_1$ to $C_{12}$ alkanediyl, which may be interrupted by one or more O atoms, and
  (b) a divalent group $-D^{L11}-Ar^{L11}-D^{L11}-$;
$Z^{L2}$, $Z^{L3}$ are independently selected from the group consisting of a chemical bond and hydroxyethanediyl;
n is an integer of from 1 to 400;
m is 0 or an integer of from 1 to 400;
o is an integer of from 1 to 100; and
p is 0 or 1.

2. The composition according to claim 1, wherein $D^{L1}$ is selected from the group consisting of (i) a linear $C_2$ to $C_{10}$ alkanediyl group, (ii) a $C_2$ to $C_3$ oxyalkylene group, and (iii) a divalent phenyl or pyridyl group.

3. The composition according to claim 1, wherein A and A' are the same or different, and are amine fragments independently selected from the group consisting of formula L3a, wherein $D^{L2}$ is selected from the group consisting of methanediyl, ethanediyl and 1,3-propanediyl.

4. The composition according to claim 1, wherein A and A' are the same or different, and are amine fragments independently selected from the group consisting of formula L3b, wherein $D^{L21}$, $D^{L22}$, and $D^{L23}$ are independently selected from the group consisting of methanediyl, ethanediyl, and propanediyl.

5. The composition according to claim 1, wherein Z is selected from the group consisting of $C_1$ to $C_{12}$ alkanediyl, a bis(2-ethanediyl)ether group, 2-hydroxypropane-1,3-diyl, and 4,4'-bis(methyl)biphenyl.

6. The composition according to claim 1, wherein the acid is selected from the group consisting of sulfuric acid and methane sulfonic acid.

7. The composition according to claim 1, wherein n is an integer from 2 to 200.

8. The composition according to claim 1, wherein m is 0 or an integer from 1 to 200.

9. The composition according to claim 1, wherein m is not 0 and a ratio of n to m is from 10:90 to 95:5.

10. The composition according to claim 1, wherein a mass average molecular weight $M_w$ of the polyaminoamide is of from 450 g/mol to 150000 g/mol.

11. The composition according to claim 1, further comprising one or more accelerating agents, one or more suppressing agents, or a combination thereof.

12. A method for depositing copper on a substrate comprising a recessed feature comprising a conductive feature bottom and a dielectric feature side wall, wherein the recessed feature has an aperture size from 500 nm to 500 µm, the method comprising applying the aquwous composition of claim 1 to the substrate.

13. A process for electrodepositing copper on a substrate comprising a recessed feature comprising a conductive feature bottom and a dielectric feature side wall, the process comprising:
  a) contacting a composition according to claim 1 with the substrate, and
  b) applying a current to the substrate for a time sufficient to deposit a copper layer into the recessed feature, wherein the recessed feature has an aperture size from 500 nm to 500 µm.

14. The process according to claim 13, wherein the aperture size is from 1 µm to 200 µm.

15. The composition according to claim 1, wherein B is a diacid fragment of formula L2

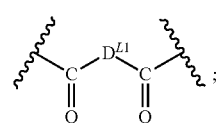
(L2)

A, A' are amine fragments independently selected from the group consisting of formula L3a

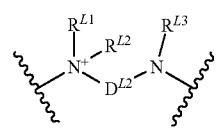
(L3a)

and formula L3b

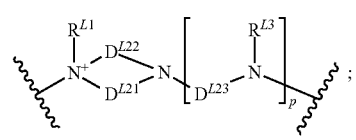
(L3b)

$D^{L1}$ is selected from the group consisting of
  (a) a chemical bond and
  (b) a divalent group selected from the group consisting of
    (i) $C_1$-$C_{20}$-alkanediyl which may optionally be interrupted by a double bond, an imino group or is optionally, completely or partially, a constituent of one or more saturated, unsaturated or aromatic 5- to 10-membered rings, and
    (ii) an ether or polyether group of formula L2a
$$-(D^{L10}-O-)_oD^{L10}- \quad (L2a);$$

$D^{L2}$ is a divalent group selected from the group consisting of
  (a) a linear or branched $C_1$ to $C_{10}$ alkanediyl, which may optionally be interrupted by $NR^{L10}$ or O, or substituted by 1 or 2 groups $NR^{L10}R^{L11}$ or $OR^{L10}$, and
  (b) $-D^{L11}-Ar^{L11}-D^{L11}-$;
$D^{L10}$ is a $C_1$-$C_6$-alkanediyl;
$D^{L11}$ is a $C_1$-$C_6$-alkanediyl;
$Ar^{L11}$ is a $C_6$ to $C_{10}$ aromatic moiety;
$D^{L21}$, $D^{L22}$ are independently selected from the group consisting of a linear or branched $C_1$ to $C_6$ alkanediyl;
$D^{L23}$ is a $C_1$ to $C_6$ alkanediyl;
$R^{L1}$, $R^{L2}$ are independently selected from the group consisting of $C_1$ to $C_6$ alkyls;
$R^{L3}$ is selected from the group consisting of H and $C_1$ to $C_6$ alkyls;
Y is a co-monomer fragment;
Z is a divalent coupling fragment of formula L4

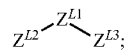
(L4)

$Z^{L1}$ is selected from the group consisting of
(a) a linear or branched $C_1$ to $C_{12}$ alkanediyl, which may be interrupted by one or more O atoms, and
(b) a divalent group $-D^{L11}-Ar^{L11}-D^{L11}-$;

$Z^{L2}$, $Z^{L3}$ are independently selected from the group consisting of a chemical bond and hydroxyethanediyl;

n is an integer of from 1 to 400;

m is 0 or an integer of from 1 to 400;

o is an integer of from 1 to 100; and p is 0 or 1.

16. The composition according to claim 1, wherein B is a diacid fragment of formula L2

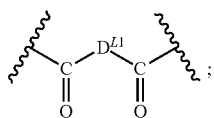

(L2)

A, A' are amine fragments independently selected from the group consisting of formula L3a

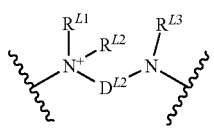

(L3a)

and formula L3b

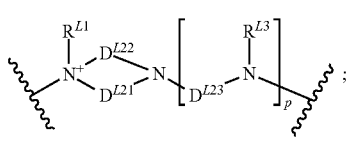

(L3b)

$D^{L1}$ is selected from the group consisting of
(a) a chemical bond and
(b) a divalent group selected from the group consisting of
(i) $C_1$-$C_{20}$-alkanediyl which may optionally be interrupted by a double bond, an imino group or is optionally, completely or partially, a constituent of one or more saturated, unsaturated or aromatic 5- to 10-membered rings, and
(ii) an ether or polyether group of formula L2a $-(D^{L10}-O-]_o D^{L10}-$  (L2a);

$D^{L2}$ is a divalent group selected from the group consisting of
(a) a linear or branched $C_1$ to $C_{10}$ alkanediyl, which may optionally be interrupted by $NR^{L10}$ or O, or substituted by one or more groups $NR^{L10}R^{L11}$ or $OR^{L10}$, and
(b) $-D^{L11}-Ar^{L11}-D^{L11}-$;

$D^{L10}$ is ethanediyl or propanediyl;

$D^{L11}$ is a $C_1$-$C_6$-alkanediyl;

$Ar^{L11}$ is a $C_6$ to $C_{10}$ aromatic moiety;

$D^{L21}$, $D^{L22}$ are independently selected from the group consisting of a linear or branched $C_1$ to $C_6$ alkanediyl;

$D^{L23}$ is a $C_1$ to $C_6$ alkanediyl;

$R^{L1}$, $R^{L2}$ are independently selected from the group consisting of $C_1$ to $C_6$ alkyls;

$R^{L3}$ is selected from the group consisting of H and $C_1$ to $C_6$ alkyls;

Y is a co-monomer fragment;

Z is a divalent coupling fragment of formula L4

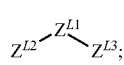

(L4)

$Z^{L1}$ is selected from the group consisting of
(a) a linear or branched $C_1$ to $C_{12}$ alkanediyl, which may be interrupted by one or more O atoms, and
(b) a divalent group $-D^{L11}-Ar^{L11}-D^{L11}-$;

$Z^{L2}$, $Z^{L3}$ are independently selected from the group consisting of a chemical bond and hydroxyethanediyl;

n is an integer of from 1 to 400;

m is 0 or an integer of from 1 to 400;

o is an integer of from 1 to 100; and p is 0 or 1.

17. The composition according to claim 1, wherein A and A' are the same, and are amine fragments independently selected from the group consisting of formula L3a, wherein $D^{L2}$ is selected from the group consisting of methanediyl, ethanediyl and 1,3-propanediyl.

18. The composition according to claim 1, wherein A and A' are the same, and are amine fragments independently selected from the group consisting of formula L3b, wherein $D^{L21}$, $D^{L22}$, and $D^{L23}$ are independently selected from the group consisting of methanediyl, ethanediyl, and propanediyl.

19. The composition according to claim 1, wherein n is an integer from 2 to 150.

20. The composition according to claim 1, wherein m is 0 or an integer from 2 to 150.

* * * * *